United States Patent
Yu et al.

(10) Patent No.: US 9,324,756 B2
(45) Date of Patent: Apr. 26, 2016

(54) CIS CHIPS AND METHODS FOR FORMING THE SAME

(75) Inventors: Chen-Hua Yu, Hsin-Chu (TW);
Wen-Chih Chiou, Miaoli (TW);
Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 300 days.

(21) Appl. No.: 13/558,063

(22) Filed: Jul. 25, 2012

(65) Prior Publication Data

US 2014/0027872 A1    Jan. 30, 2014

(51) Int. Cl.
| | | |
|---|---|---|
| H01L 31/0232 | (2014.01) | |
| H01L 27/146 | (2006.01) | |
| H01L 31/02 | (2006.01) | |
| H01L 21/768 | (2006.01) | |
| H01L 23/48 | (2006.01) | |
| H01L 21/683 | (2006.01) | |
| H01L 23/00 | (2006.01) | |

(52) U.S. Cl.
CPC ...... *H01L 27/14636* (2013.01); *H01L 21/6835* (2013.01); *H01L 21/76898* (2013.01); *H01L 23/481* (2013.01); *H01L 27/14685* (2013.01); *H01L 31/02002* (2013.01); *H01L 31/02327* (2013.01); *H01L 24/13* (2013.01); *H01L 27/14621* (2013.01); *H01L 27/14627* (2013.01); *H01L 2221/6834* (2013.01); *H01L 2221/68327* (2013.01); *H01L 2224/023* (2013.01); *H01L 2224/13101* (2013.01)

(58) Field of Classification Search
CPC .............. H01L 31/02002; H01L 31/02327; H01L 2224/023
USPC .......... 257/432, E21.127, E31.124, E23.011, 257/E23.174
See application file for complete search history.

(56) References Cited

U.S. PATENT DOCUMENTS

| | | | |
|---|---|---|---|
| 6,057,038 A | 5/2000 | Terashita et al. | |
| 6,774,039 B1 | 8/2004 | Drewery | |
| 2007/0228576 A1 | 10/2007 | Trezza | |
| 2008/0237766 A1 * | 10/2008 | Kim | 257/432 |
| 2010/0102426 A1 * | 4/2010 | Park et al. | 257/686 |
| 2011/0129955 A1 * | 6/2011 | Gambino et al. | 438/70 |
| 2011/0221018 A1 * | 9/2011 | Shi et al. | 257/432 |

* cited by examiner

*Primary Examiner* — Robert Huber
(74) *Attorney, Agent, or Firm* — Slater & Matsil, L.L.P.

(57) ABSTRACT

A device includes a semiconductor substrate, an image sensor at a front surface of the semiconductor substrate, and a plurality of dielectric layers over the image sensor. A color filter and a micro lens are disposed over the plurality of dielectric layers and aligned to the image sensor. A through via penetrates through the semiconductor substrate. A Redistribution Line (RDL) is disposed over the plurality of dielectric layers, wherein the RDL is electrically coupled to the through via. A polymer layer covers the RDL.

19 Claims, 18 Drawing Sheets

CIS CHIPS AND METHODS FOR FORMING THE SAME

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in the minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and length of interconnections between devices as the number of devices increases. When the number and length of interconnections increase, both circuit RC delay and power consumption increase.

Among the efforts for resolving the above-discussed limitations, three-dimensional integrated circuit (3DIC) and stacked dies are commonly used. Through-Silicon vias (TSVs) are often used in 3DICs and stacked dies for connecting dies. In this case, TSVs are used to connect the integrated circuits on a die to the backside of the die. In addition, TSVs may also be used to provide a short grounding path to connect the ground in the integrated circuits to the backside of the die.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 16A are cross-sectional views of intermediate stages in the manufacturing of a Complementary Metal-Oxide-Semiconductor (CMOS) Image Sensor (CIS) chip in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A process for forming Through-Substrate Vias (TSVs, also referred to as through-silicon vias, through-semiconductor vias, or through vias) in Complementary Metal-Oxide-Semiconductor (CMOS) Image Sensor (CIS) chips is provided. The intermediate stages in the manufacturing the CIS chips are illustrated in accordance with some exemplary embodiments. The variations of the embodiments are discussed. Throughout the various views and illustrative embodiments of the present invention, like reference numbers are used to designate like elements.

Figure 1:
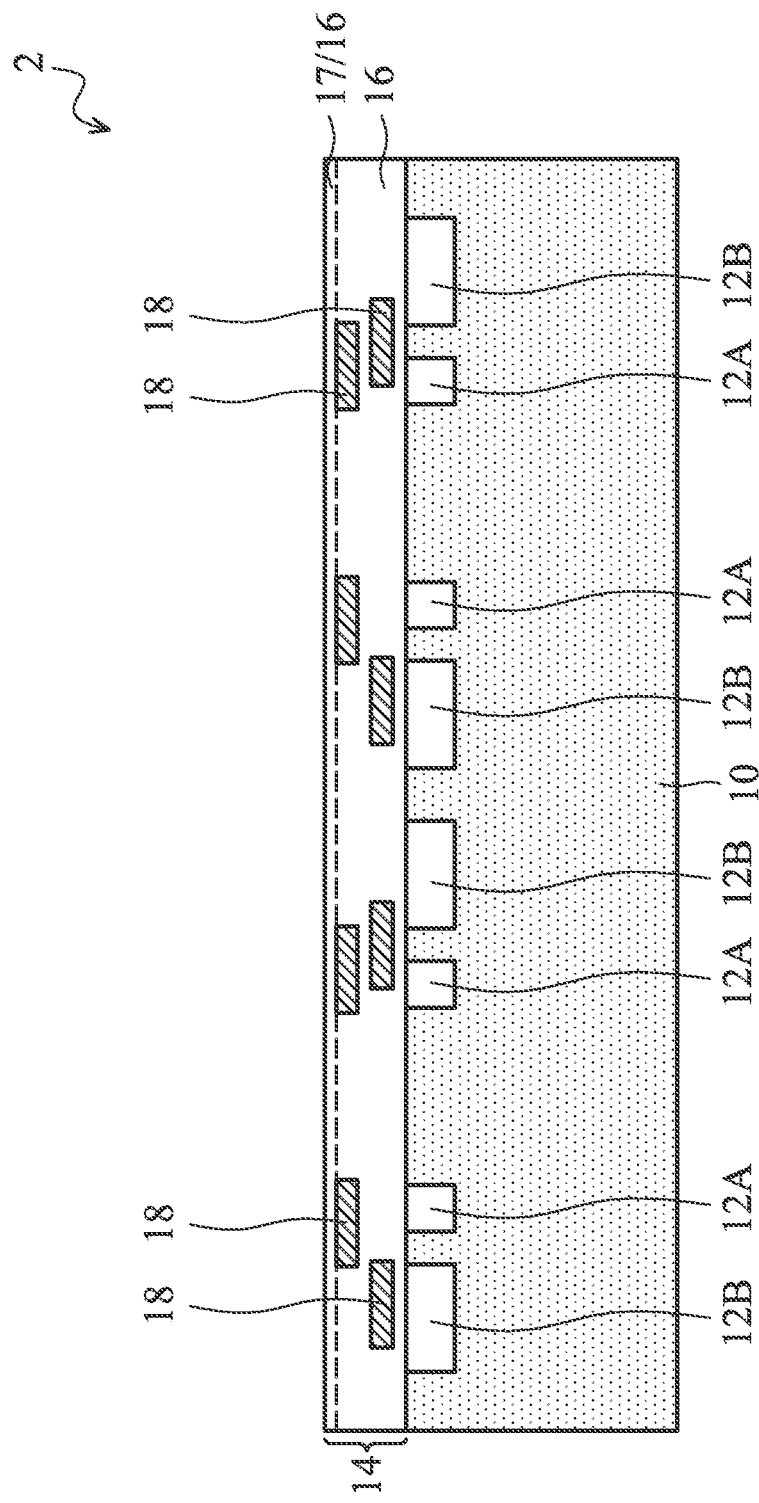

Referring to FIG. 1, wafer 2, which includes substrate 10, is formed. Substrate 10 may be a semiconductor substrate such as a bulk silicon substrate. Alternatively, substrate 10 may include other semiconductor materials such as group III, group IV, and/or group V elements. Integrated circuit devices 12A such as transistors, resistors, capacitors, and the like, may be formed at the top surface (the surface facing up in FIG. 1) of substrate 10. Integrated circuit devices 12A may form the digital controller, digital image processing circuits, and/or the like. In addition, image sensors 12B, which may be photo diodes, are also formed at the top surface of substrate 10. Wafer 2 is thus an image sensor wafer.

Front-side interconnect structure 14 is formed over semiconductor substrate 10, and is used to electrically interconnect devices 12A and image sensors 12B in image sensor wafer 2. Front-side interconnect structure 14 includes dielectric layers 16, and contact plugs, metal lines and vias (schematically illustrated as 18) in dielectric layers 16. Dielectric layers 16 may include an Inter-Layer Dielectric (ILD), Inter-Metal Dielectric (IMD) layers over the ILD, and passivation layer 17 over the IMD layers. For example, the ILD may be formed of Phospho-Silicate Glass (PSG), Boro-Silicate Glass (BSG), Boron-doped Phospho-Silicate Glass (BPSG), Tetra Ethyl Ortho Silicate (TEOS) oxide, or the like. The IMD layers may be formed of low-k dielectric materials, which have k values lower than about 2.5, for example. Passivation layer 17 has a non-low-k value greater than 3.9, and may include an oxide layer and a nitride over the oxide layer, for example. Throughout the description, the metal lines in a same dielectric layer 16 are collectively referred to as being a metal layer. Front-side interconnect structure 14 may include a plurality of metal layers, which may include four or more metal layers.

Figure 2:
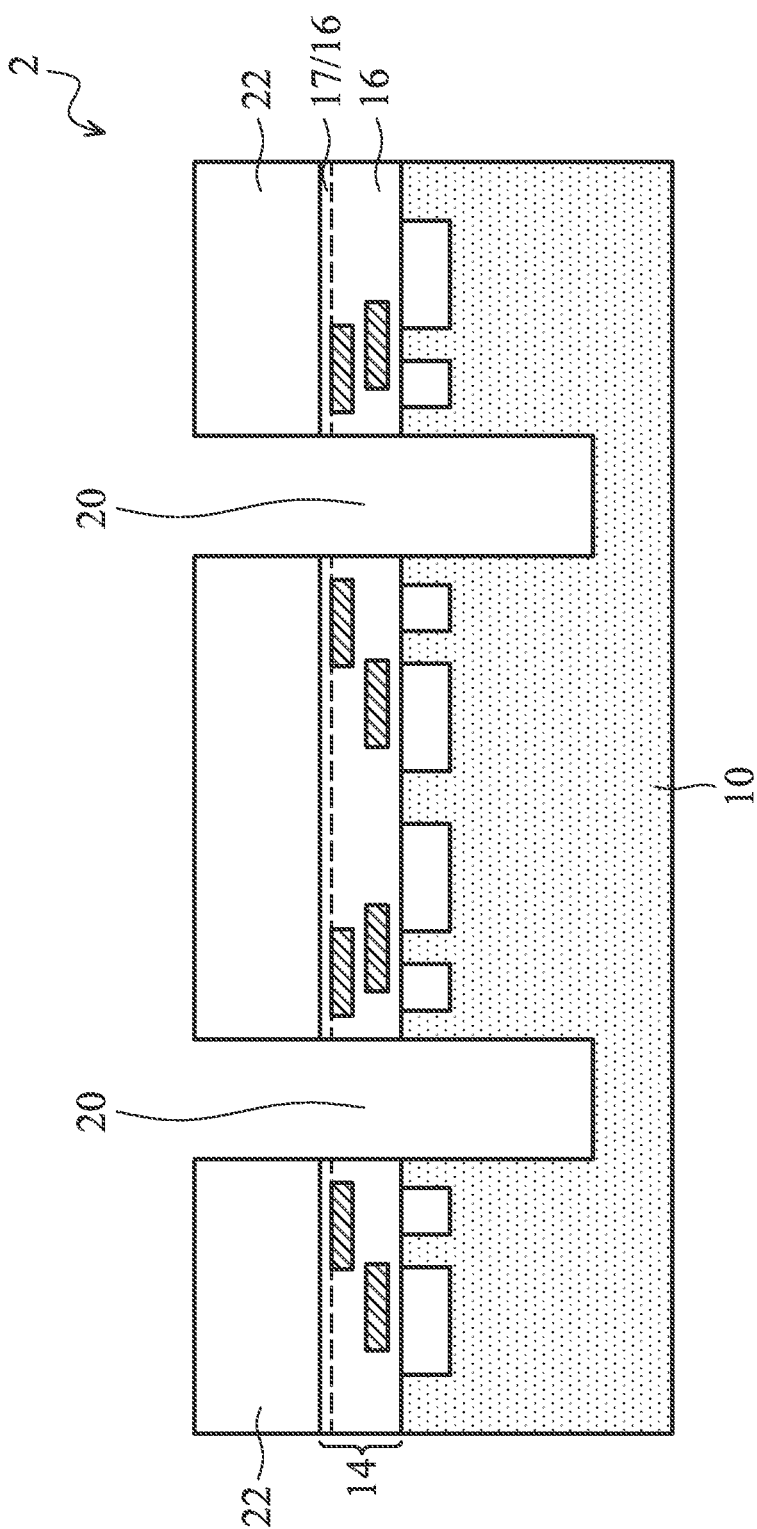

FIG. 2 illustrates the formation and the patterning of photo resist 22, through which the underlying dielectric layers 16 (such as passivation layer 17) is exposed. A first etch is then performed to form TSV openings 20 in dielectric layers 16. Substrate 10 is then etched so that TSV openings 20 further extend into substrate 10, for example, using an anisotropic etch. After the formation of TSV openings 20, photo resist 22 is removed.

Figure 3:
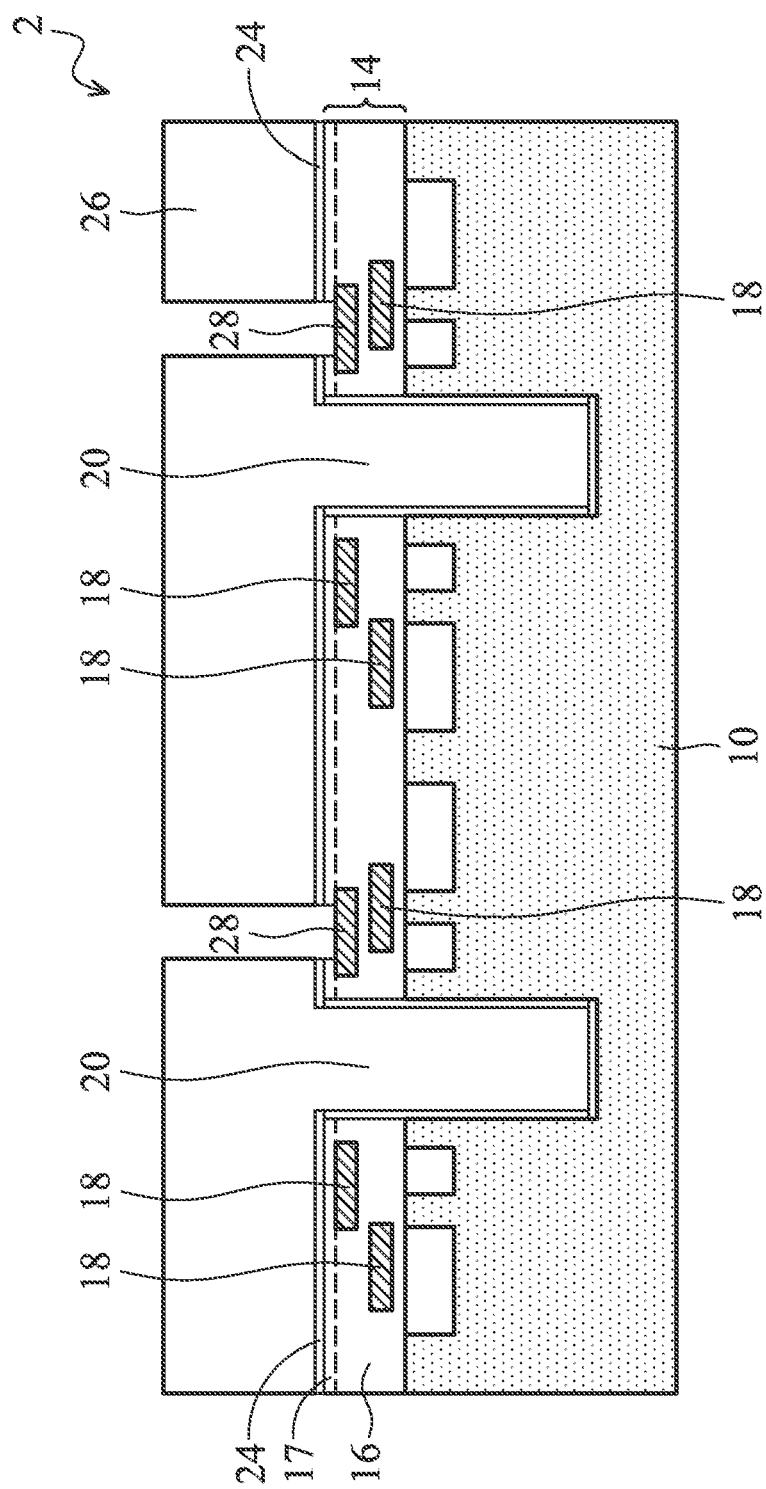

FIG. 3 illustrates the formation of insulating layer 24. Insulating layer 24 may be a blanket layer, and hence includes portions on the sidewalls and the bottoms of TSV openings 20. Insulating layer 24 further includes horizontal portions that are overlying dielectric layers 16. Insulating layer 24 may be formed of dielectric materials such as silicon nitride, silicon carbide, silicon oxynitride, and the like. Next, photo resist 26 is applied and patterned, with the portions photo resist 26 that overlap TSV pads 28 being removed. The portions of insulating layer 24 that are exposed through the patterned photo resist 26 are then etched, exposing the underlying TSV pads 28. Photo resist 26 is then removed. TSV pads 28 may the metal pads that are formed underlying one of passivation layers (such as passivation layer 17). TSV pads 28 are electrically coupled to devices 12A and/or image sensors 12B in accordance with some embodiments, for example, through metal lines/vias/contact plugs 18. Furthermore, TSV pads 28 may be formed of aluminum copper, although other metallic materials may also be used.

Figure 4:
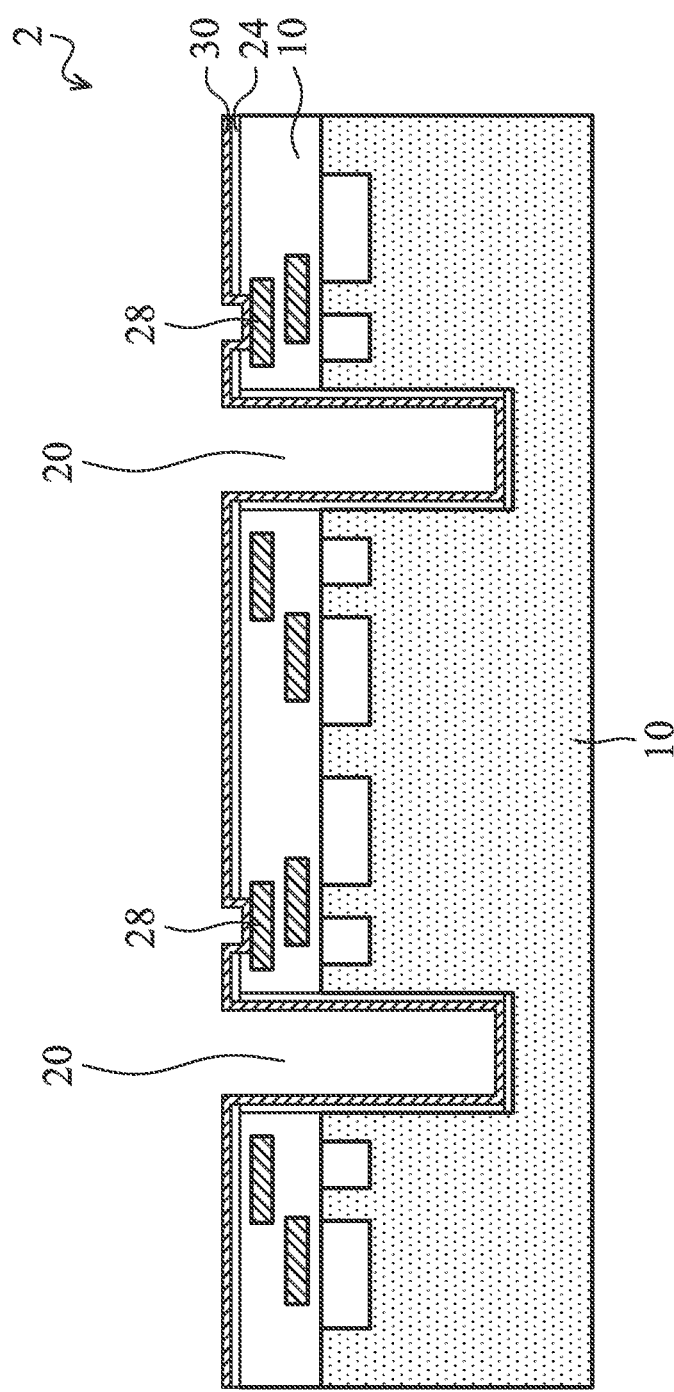

Referring to FIG. 4, diffusion barrier layer 30, also sometimes referred to as a glue layer, is blanket formed to cover the sidewalls and the bottoms of TSV openings 20. Diffusion barrier layer 30 may include a material selected from titanium, titanium nitride, tantalum, tantalum nitride, and combinations thereof, and can be formed using Physical Vapor Deposition (PVD), Plasma Enhanced Chemical Vapor Deposition (PECVD), or the like.

A thin seed layer (also denoted as 30) is then blanket formed on diffusion barrier layer 30. The available materials of seed layer 30 include copper or copper alloys. Furthermore, metals such as silver, gold, aluminum, or combinations thereof may also be used. In some embodiments, seed layer 30 is formed using PVD.

Figure 5:
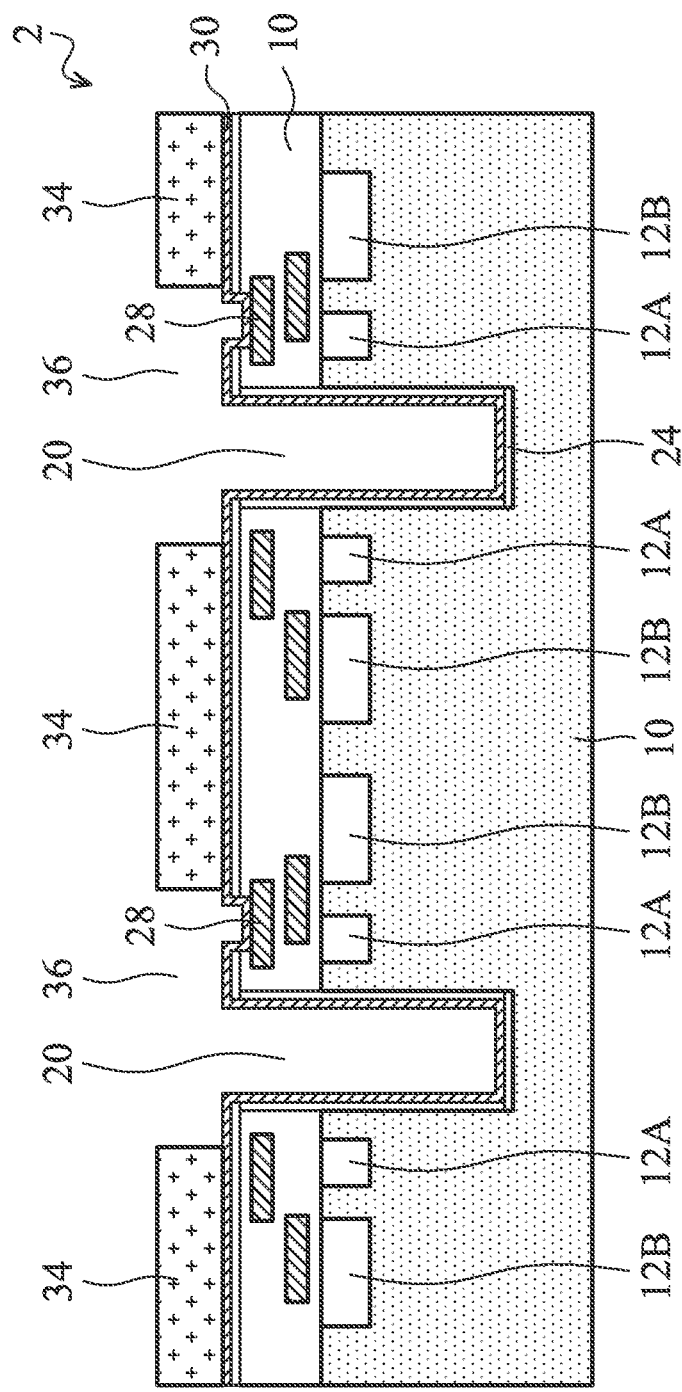

FIG. 5 illustrates the formation of mask 34. In some embodiments, mask 34 is a dry film, and thus is referred to as dry film 34 throughout the description. Dry film 34 may comprise an organic material such as Ajinimoto buildup film (ABF). In the embodiments mask 34 is the dry film, the dry film is laminated on the structure shown in FIG. 4. Heat and pressure are then applied to the laminated dry film to soften it so that a flat top surface is formed. The laminated dry film 34 is then patterned. In alternative embodiments, mask 34 is a photo resist. In some exemplary embodiments, the resulting TSVs 40 (FIG. 6) need to be electrically connected to devices 12A and/or 12B through TSV pads 28. Accordingly, openings 36 are formed in dry film 34, exposing portions of diffusion barrier/seed layer 30, which portions are over TSV pads 28, TSV openings 20, and the region therebetween.

Figure 6:
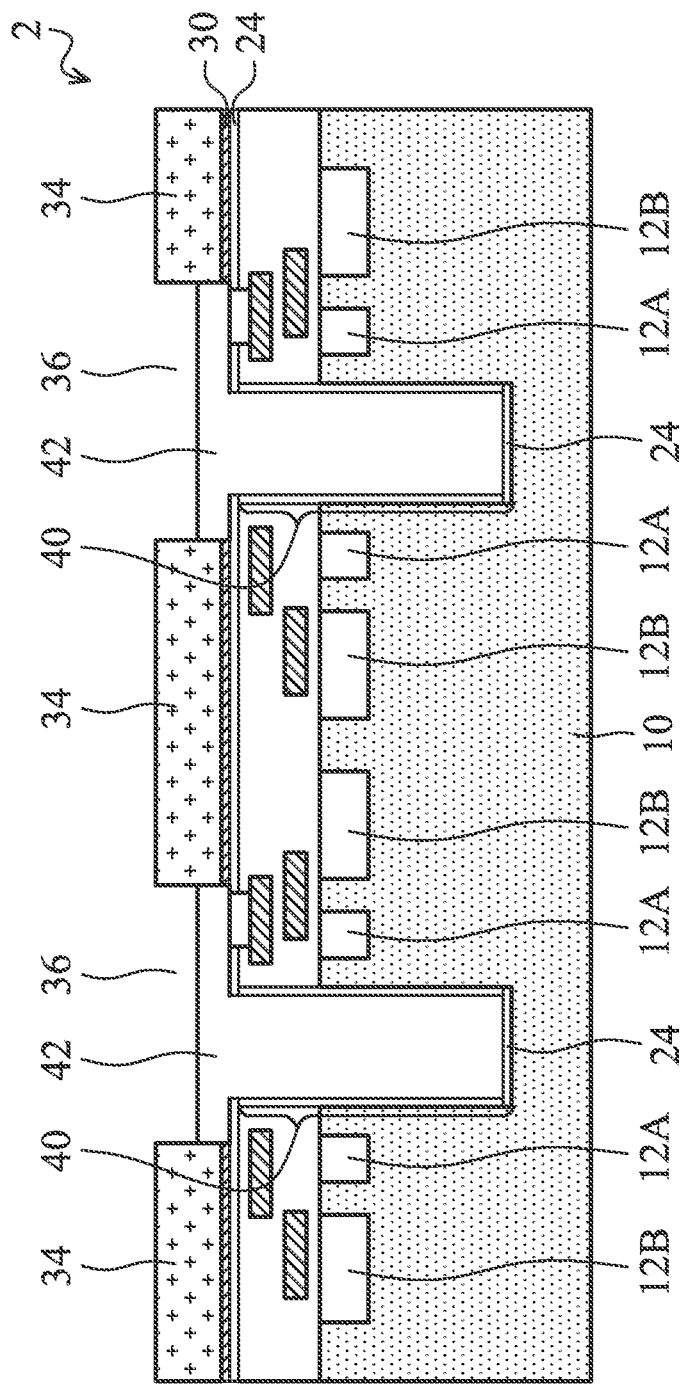

In FIG. 6, TSV openings 20 are filled with a metallic material, forming TSVS 40 in openings 20. In some embodiments, the filling material includes copper or copper alloys. However, other metals, such as aluminum, silver, gold, and combinations thereof, may also be used. The formation method may be electroless plating, for example. After openings 20 are filled, the same metallic material may be continuously filled in openings 36, forming Redistribution lines (RDLs) 42. RDLs 42 are also referred to as Post-Passivation Interconnect (PPI) lines 42, which electrically couple TSV pads 28 to TSVS 40.

Figure 7:
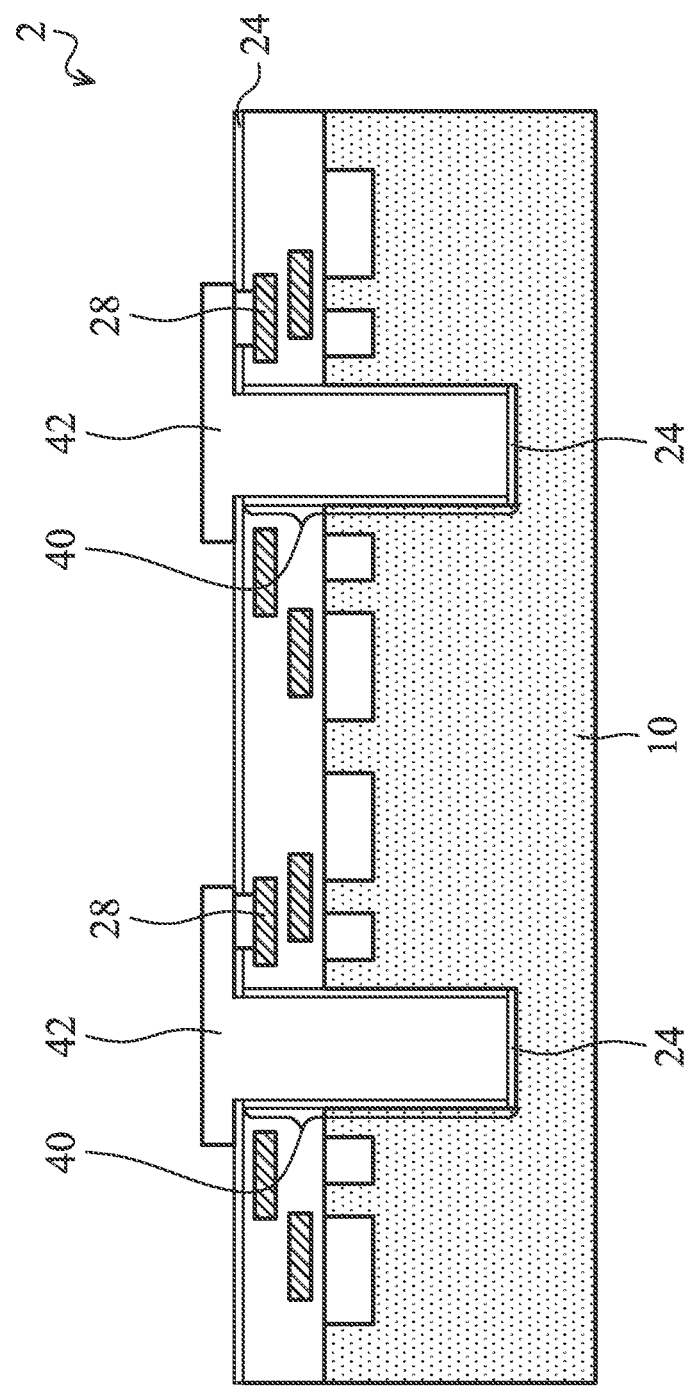

Mask 34 is then removed. As a result, the portions of barrier/seed layer 30, which portions are underlying dry film 34, are exposed. The exposed portions of barrier/seed layer 30 are then removed. The resulting structure is shown in FIG. 7. Barrier/seed layer 30 forms portions of the resulting TSVs 40 and RDLs 42, and hence is not marked in subsequent drawings.

Figure 8:
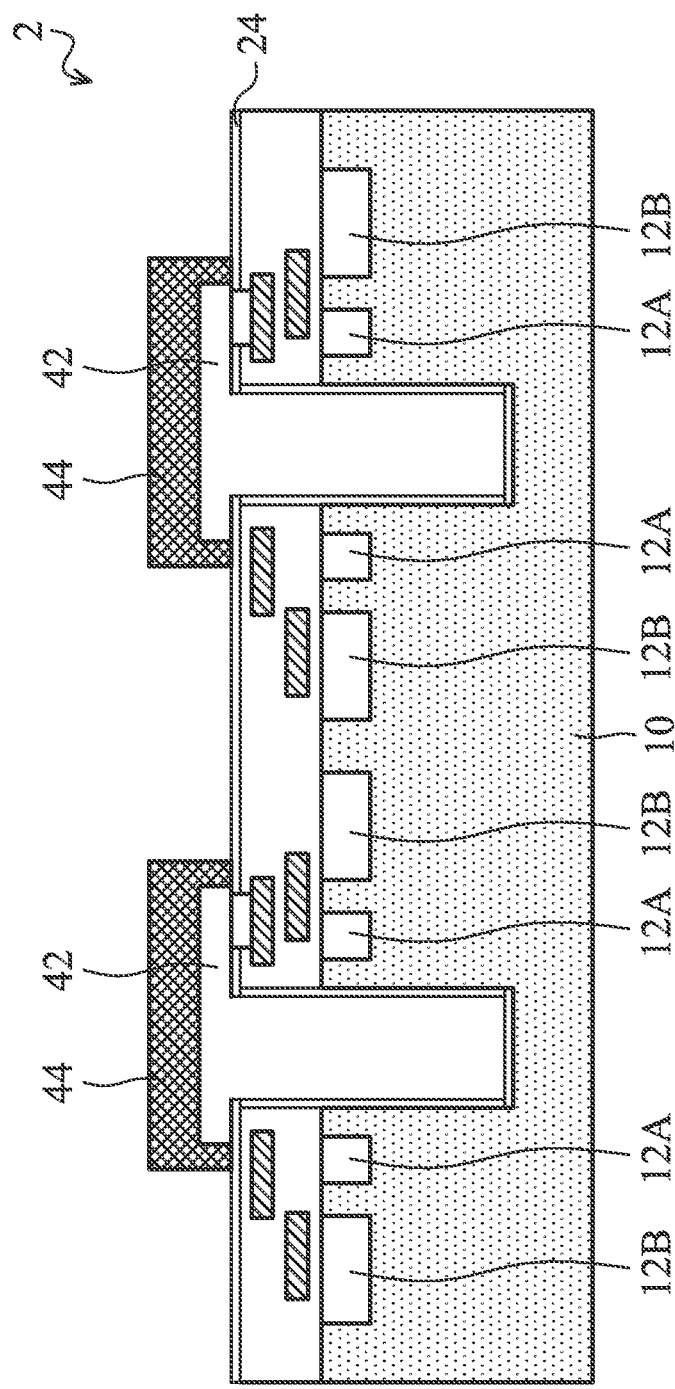

Next, as shown in FIG. 8, polymer layer 44 is dispended and cured. A patterning step is then performed on polymer layer 44 to remove some portions, while leaving some other portions of polymer layer 44 un-removed. Polymer layer 44 may be formed of polyimide, PolyBenzOxazole (PBO), BenzoCycloButene (BCB), or the like, which may be photo-sensitive materials. By using the photo-sensitive material to form polymer 44, the patterning of polymer layer 44 is simplified, and the respective manufacturing cost is reduced. The portions of polymer layer 44 that overlap image sensors 12B are removed. On the other hand, the remaining portions of polymer layer 44 cover the top surfaces and the sidewalls of metal lines 42. Accordingly, metal lines 42 are protected by polymer layer 44, and are isolated from detrimental substances (such as moisture and chemicals) that may damage metal lines 42 and TSVs 40.

Figure 9:
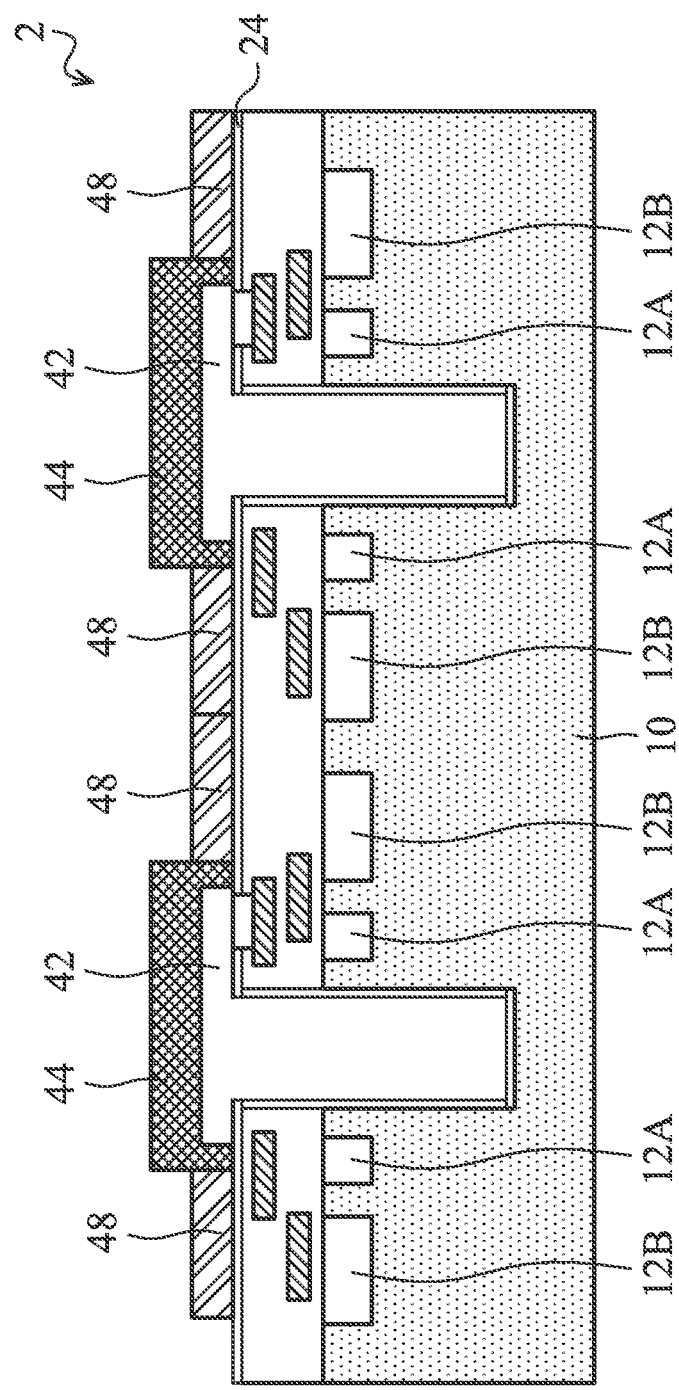
Figure 10:
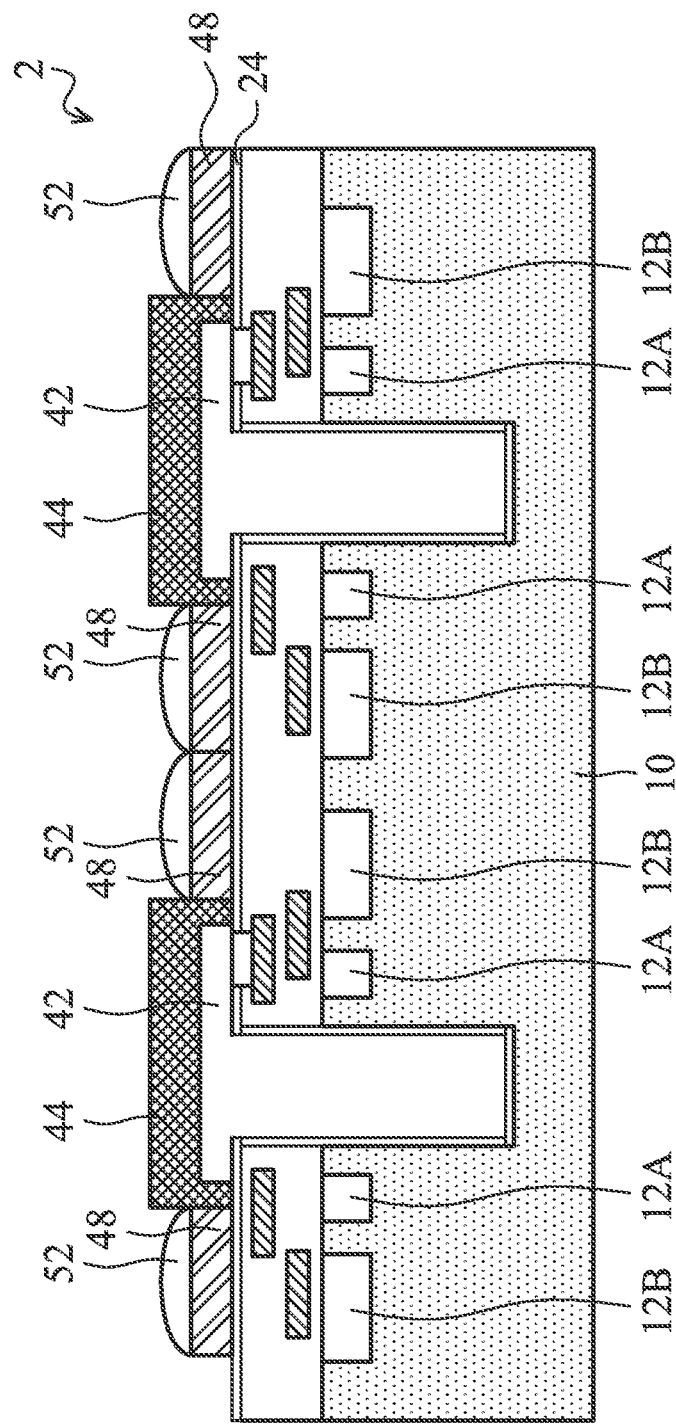

Next, referring to FIG. 9, color filters 48 are formed, which may include red color filters, green color filters, and blue color filters. Color filters 48 may be formed of polymers that are configured to selectively allow the red light, the green light, and the blue light, etc. to pass through. The formation process for each of color filters 48 may include a deposition step and an etching step. In subsequent process steps, as shown in FIG. 10, additional components such as micro lenses 52 are formed, with each of color filters 48 and micro lenses 52 overlapping one of image sensors 12B.

Figure 11:
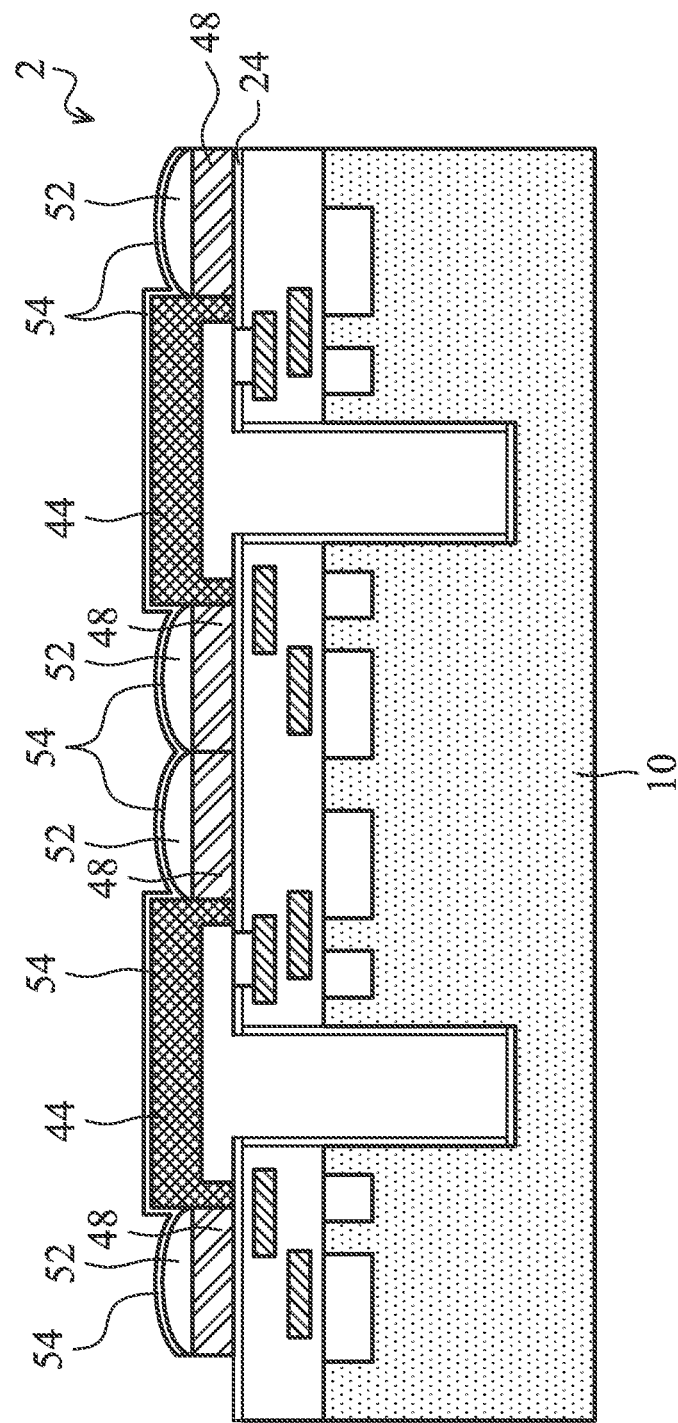
Figure 12:
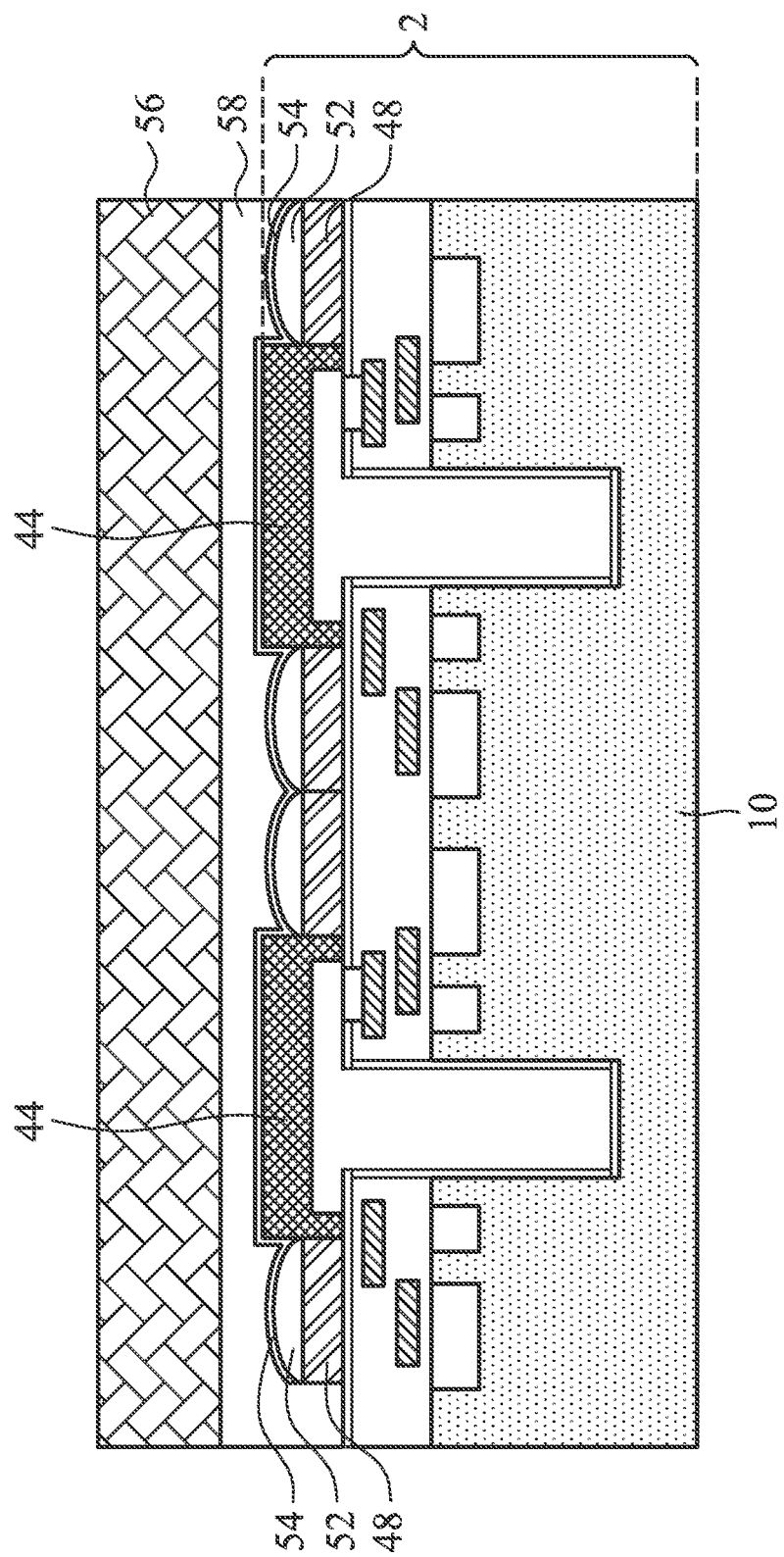
Figure 15:
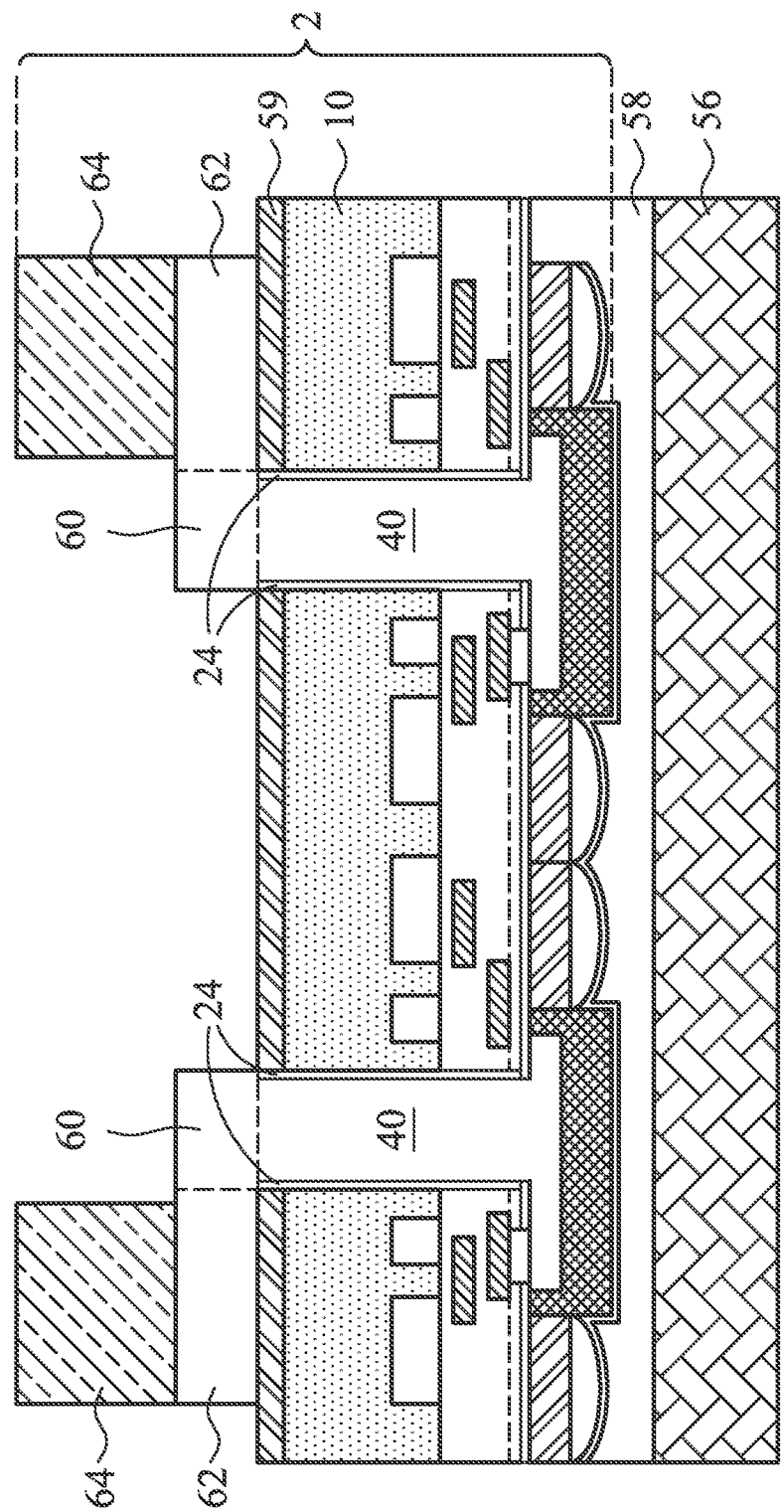

In FIG. 11, protection layer 54 is formed on micro lenses 52, and may be formed on the top surfaces and the sidewalls of polymer layer 44. Protection layer 54 protects micro lenses 52 from being damaged in the subsequent mounting and demounting of carrier 56 (FIGS. 12 and 15). The thickness of protection layer 54 may be smaller so that protection layer 54 is a transparent layer for visible light. In some embodiments, protection layer 54 is an oxide layer (such as a silicon oxide layer), which may be formed using PECVD or the like. Protection layer 54 may also be a TEOS oxide (which is also a silicon oxide), Un-doped Silicate Glass (USG), or the like.

Figure 13:
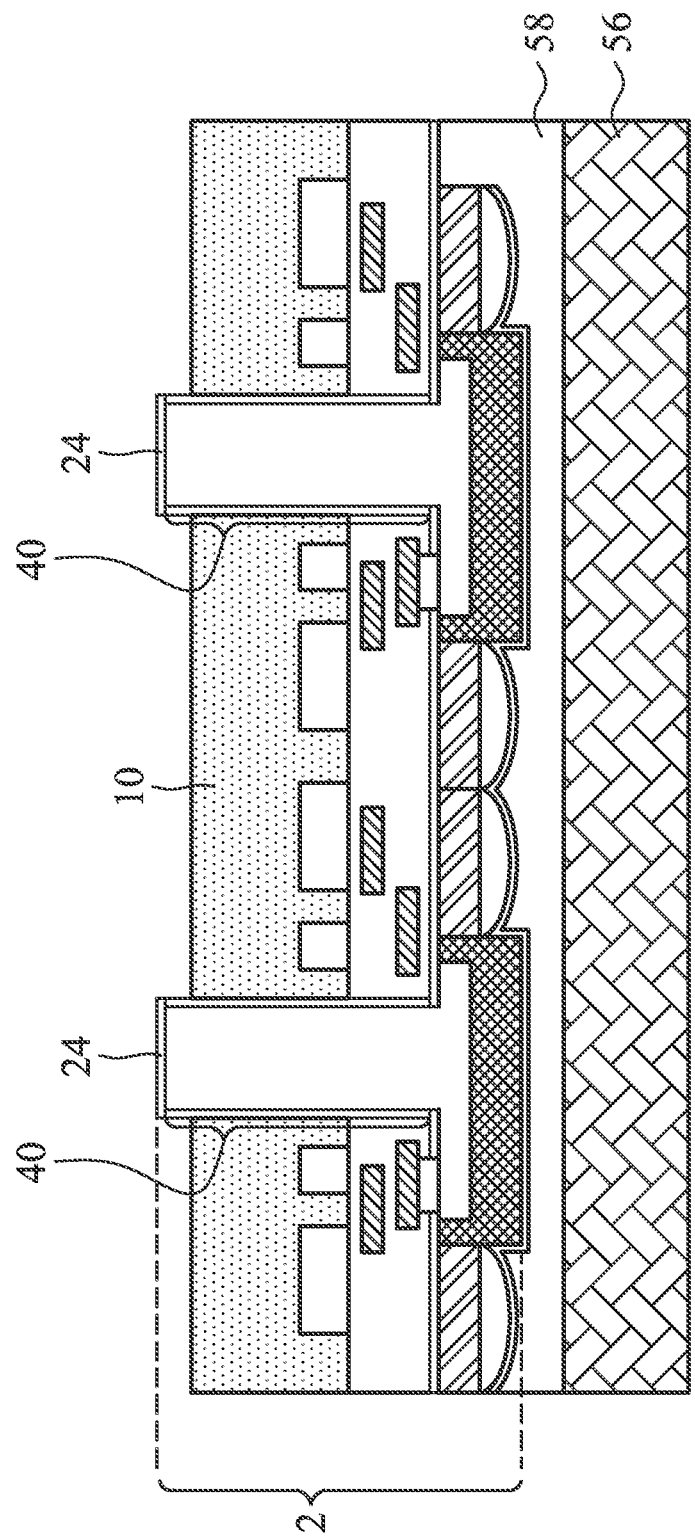
Figure 14:
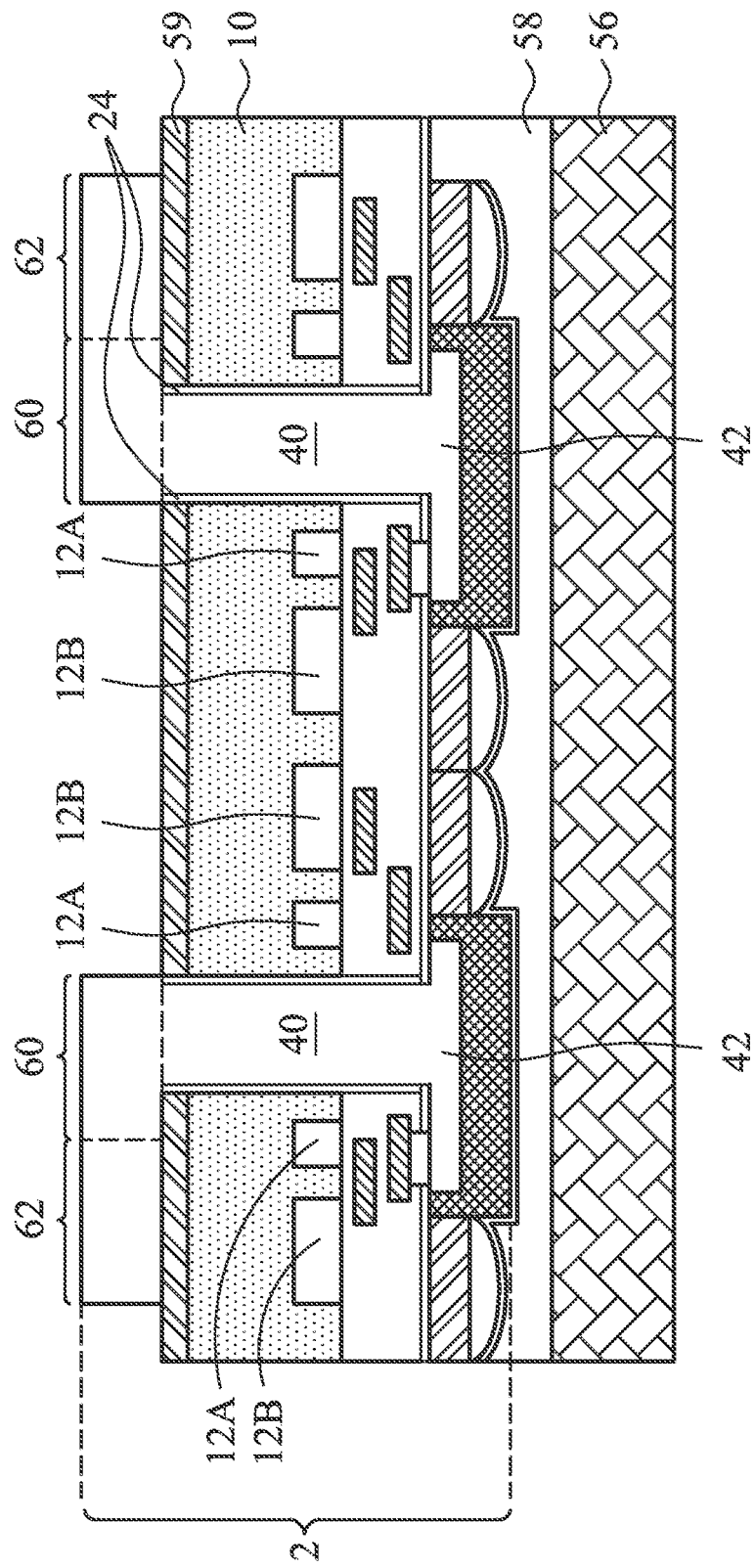

Referring to FIG. 12, wafer 2 is mounted on carrier 56, for example, through adhesive 58, wherein the top surface of wafer 2 faces carrier 56. Carrier 56 may be a glass carrier, for example. Next, as shown in FIG. 13, a thinning step is performed on the back side of substrate 10, until portions of insulating layer 24 are exposed. Dielectric layer 59 is also formed on the backside of substrate 10. Dielectric layer 59 may comprise an oxide, a nitride, or the like. A further grinding may be performed, and portions of dielectric layer 59 and the resulting exposed portions of insulating layer 24 are removed to expose TSVs 40. After the grinding, TSVs 40 protrude out of dielectric layer 59. In subsequent process steps, as shown in FIG. 14, the backside interconnect structures, which may include RDLs 60 and contact pads 62, are formed on the backside of wafer 2, for example, using a method (FIG. 6) similar to the method for forming RDLs 42.

Figure 16A:
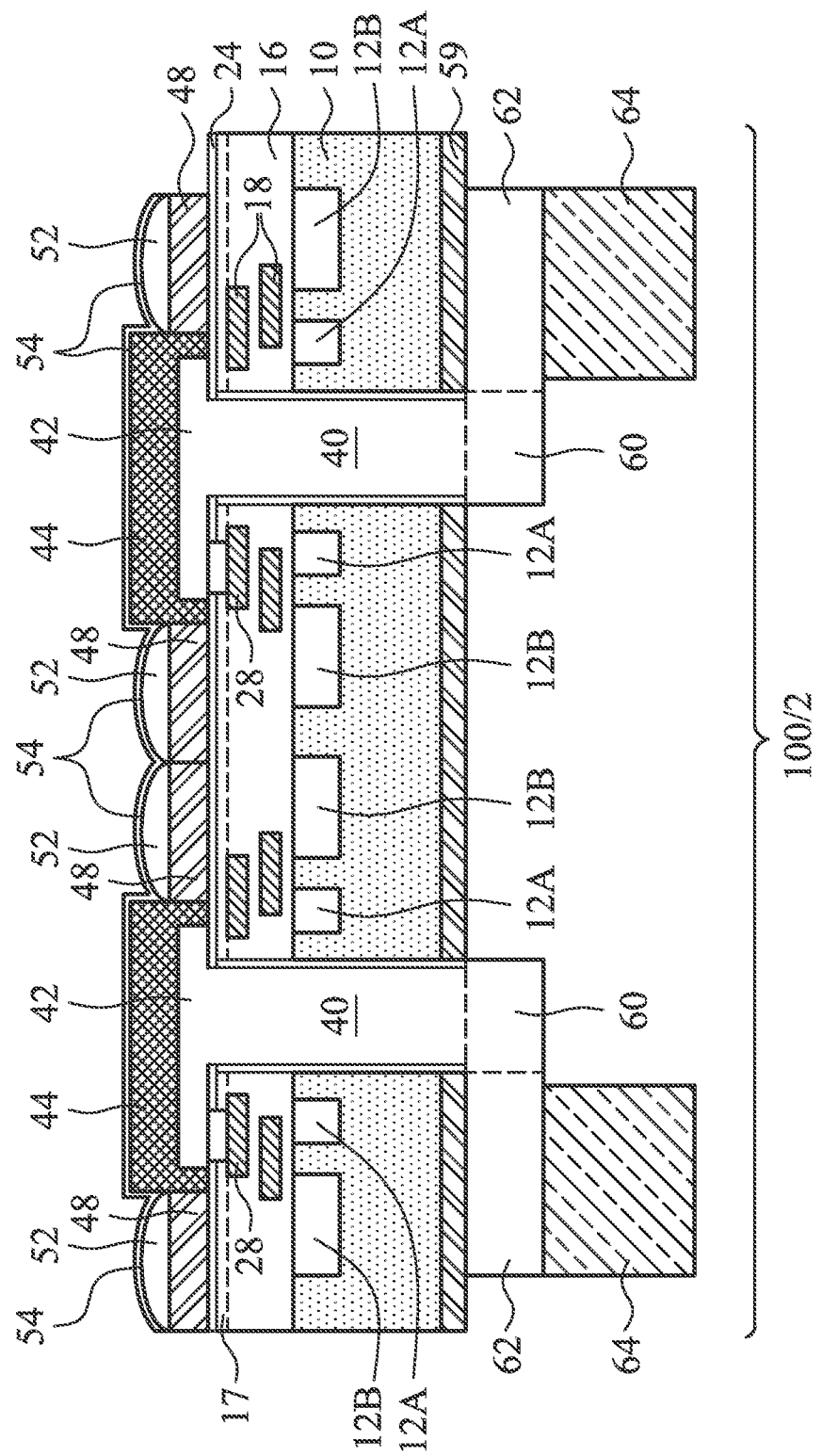

FIG. 15 illustrates the formation of electrical connectors 64. Electrical connectors 64 may be metal pillars, solder balls, composite connectors including metal pillars and overlying pre-solder layers, or the like. In a subsequent step, carrier 56 is demounted from wafer 2. The resulting wafer 2 is shown in FIG. 16A. Wafer 2 may then be diced into dies 100, which have structures identical to each other.

In the structure shown in FIG. 16A, electrical connectors 64 are formed on the backside of chip 100, and are electrically coupled to the integrated circuits (such as 12A and 12B) through metal layers and TSVs 40. On the front side (the illustrated top side) of chip 100, there may not be any electrical connector (such as solder regions) for bonding purposes. Color filters 48 and micro lenses 52 are formed on the front side of chip 100, and hence the resulting chip is a front side illumination CMOS image sensor chip. Polymer layer 44 protects the front-side RDLs 42 from being damaged by the substances in the open air. The backside RDLs 60, on the other hand, may be or may not be protected by polymer layers. When backside RDLs 60 are not protected, in the subsequent bonding process, underfill may be dispensed to protect backside RDLs 60.

Figure 16B:
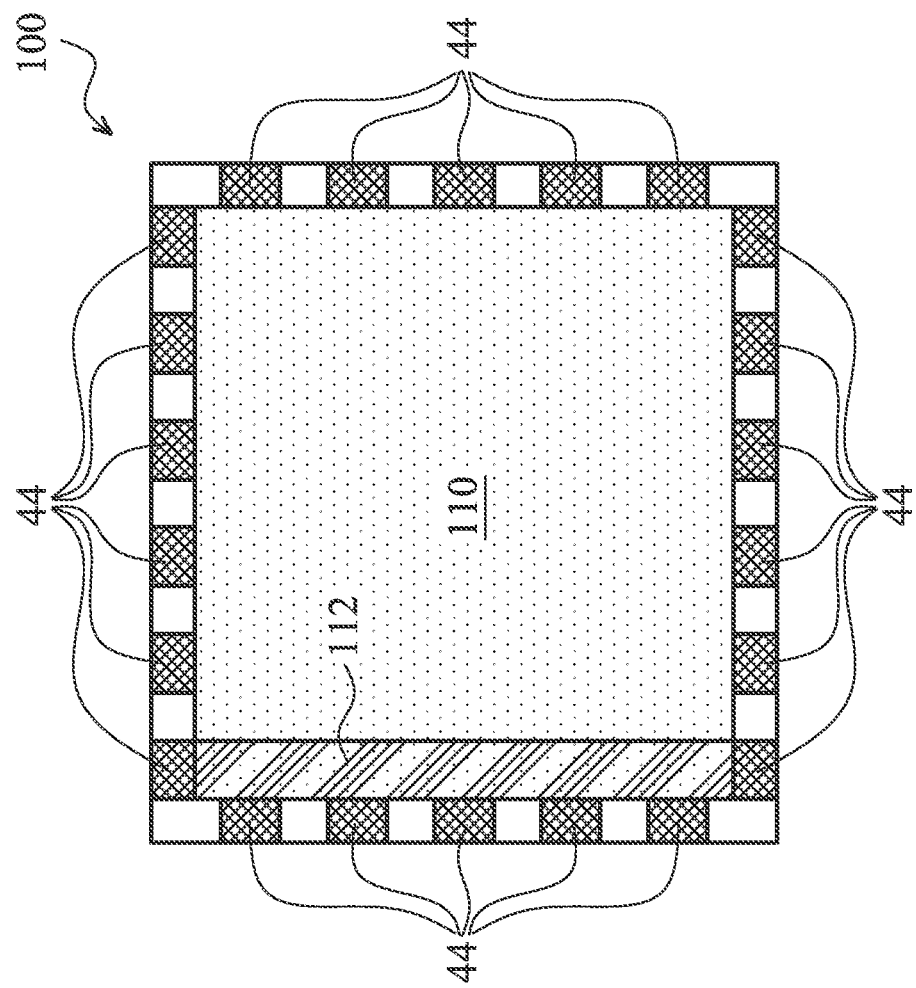
FIGS. 16B and 16C are top views of the CIS chip in accordance with exemplary embodiments.
Figure 16C:
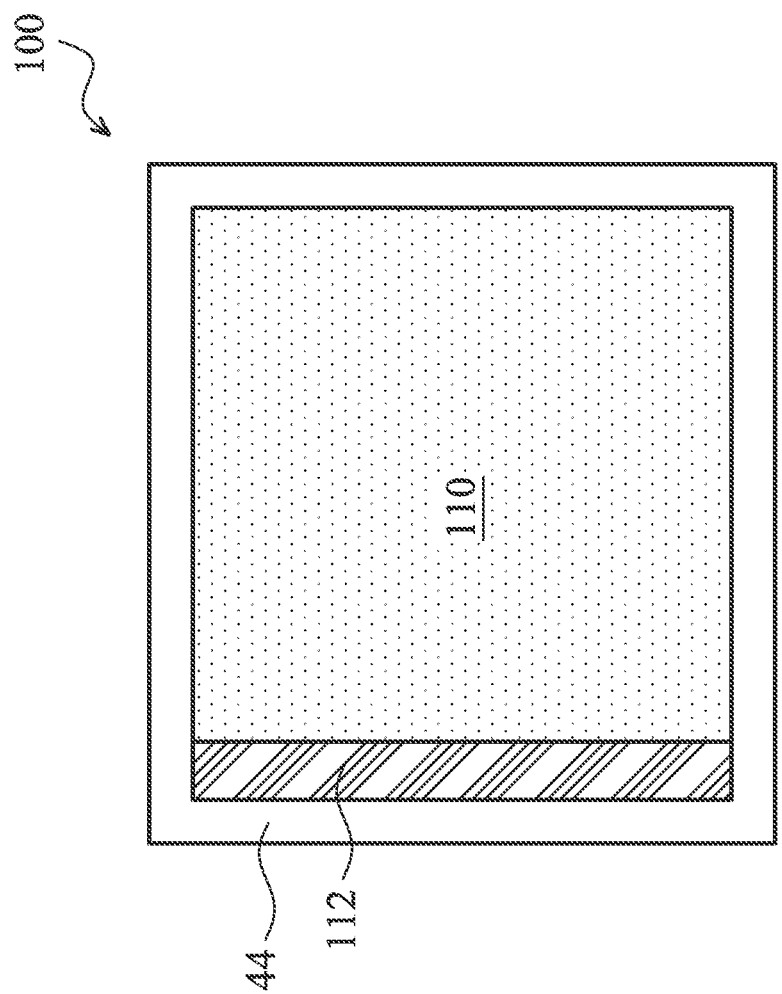

FIG. 16B illustrates a schematic top view of chip 100. As shown in FIG. 16B, chip 100 may include image sensor array 110, which includes image sensors 12B (FIG. 16A) that are laid out as an array. Digital controller 112, which may include Analog-to-Digital Converters (ADCs), Correlated Double Sampling circuits (CDS, also illustrated as 72), row decoders, or other logic circuits, are formed as a part of chip 100. Digital controller 112 may be, or may not be, covered by polymer layer 44. TSVs 40 and RDLs 42 are covered by polymer layer 44, and hence are not shown in FIG. 16B. In some embodiments, as shown in FIG. 16B, polymer layer 44 are patterned into a plurality of discrete portions disconnected from each other, each covering one of TSVs 40 and one of RDLs 42. In alternative embodiments, the illustrated portions of polymer layer 44 may be interconnected as an integrated piece, as shown in FIG. 16C. Again, in these embodiments, polymer layer 44 may or may not include portions aligned to digital controllers 112.

In accordance with embodiments, a device includes a semiconductor substrate, an image sensor at a front surface of the semiconductor substrate, and a plurality of dielectric layers over the image sensor. A color filter and a micro lens are disposed over the plurality of dielectric layers and aligned to the image sensor. A through via penetrates through the semiconductor substrate. A RDL is disposed over the plurality of dielectric layers, wherein the RDL is electrically coupled to the through via. A polymer layer covers the RDL.

In accordance with other embodiments, a device includes a semiconductor substrate, an image sensor array at a front surface of the semiconductor substrate, and an interconnector structure over the image sensor. The interconnector structure includes a plurality of dielectric layers and a passivation layer over the plurality of dielectric layers. A plurality of through vias penetrates through the semiconductor substrate, the plurality of dielectric layers, and the passivation layer. A plurality of RDLs is disposed overlying the passivation layer. A polymer layer is on a top surface and sidewalls of the plurality of RDLs. A plurality of electrical connectors is underlying the semiconductor substrate, wherein the plurality of electrical connectors is electrically coupled to the plurality of RDLs through the plurality of vias.

In accordance with yet other embodiments, a method includes etching a plurality of dielectric layers and a semiconductor substrate underlying the plurality of dielectric layers to form a through via opening. An image sensor is formed at a top surface of the semiconductor substrate, wherein the through via opening extends from the top surface into the semiconductor substrate. The method includes filling the through via opening to form a through via, forming an RDL over and electrically coupled to the through via, forming a color filter and a micro lens over the plurality of dielectric layers and aligned to the image sensor, and forming a polymer layer covering the RDL. The polymer layer is patterned to remove a first portion of the polymer layer that overlaps the micro lens, wherein a second portion of the polymer layer that overlaps the RDL remains after the step of patterning.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a semiconductor substrate;
an image sensor at a front surface of the semiconductor substrate;
a plurality of dielectric layers over the image sensor;
a through via penetrating through the semiconductor substrate and the plurality of dielectric layers;
a first Redistribution Line (RDL) over the plurality of dielectric layers, wherein the first RDL is electrically coupled to the through via, wherein the through via extends from a bottom of the first RDL to a bottom surface of the semiconductor substrate and having a substantially uniform width from the bottom of the first RDL to the bottom surface of the semiconductor substrate;
an insulation layer encircling the through via and extends from the bottom of the first RDL to the bottom surface of the semiconductor substrate;
a polymer layer covering the first RDL, wherein the polymer layer contacts a top surface and sidewalls of the first RDL;
a micro lens over the plurality of dielectric layers;
an oxide layer over the micro lens, wherein the oxide layer further comprises portions contacting a top surface of a portion of the polymer layer, with the portion of the polymer layer having a bottom surface in physical contact with a top surface of the first RDL; and
a color filter, wherein a bottom surface of the first RDL contacts a first top surface of the insulation layer, and a bottom surface of the color filter contacts a second top surface of the insulation layer, and wherein the first top surface and the second top surface of the insulation layer are coplanar with each other.

2. The device of claim 1, wherein the polymer layer comprises a photo sensitive polymer.

3. The device of claim 1, wherein the polymer layer is free from portions overlapping the micro lens.

4. The device of claim 1 further comprising:
a second RDL on a backside of the semiconductor substrate; and
an electrical connector on the backside of the semiconductor substrate, wherein the electrical connector is electrically coupled to the second RDL and the through via.

5. A device comprising:
a semiconductor substrate;
an image sensor array at a front surface of the semiconductor substrate;
an interconnector structure over the image sensor array, wherein the interconnector structure comprises:
a plurality of dielectric layers; and
a passivation layer over the plurality of dielectric layers;
a plurality of through vias penetrating through the semiconductor substrate, the plurality of dielectric layers, and the passivation layer;
a plurality of Redistribution Line (RDLs) overlying the passivation layer;
a polymer layer on a top surface and sidewalls of the plurality of RDLs, wherein the polymer layer comprises a plurality of discrete portions separated from each other, each covering one of the plurality of RDLs;
a plurality of electrical connectors underlying the semiconductor substrate, wherein the plurality of electrical connectors is electrically coupled to the plurality of RDLs through the plurality of through vias;
a plurality of color filters over the plurality of dielectric layers; and
a dielectric layer underlying the plurality of RDLs and the plurality of color filters, with bottom surfaces of the plurality of RDLs contacting a first top surface of the dielectric layer, and bottom surfaces of the plurality of color filters contacting a second top surface of the dielectric layer, wherein the first top surface and the second top surface of the dielectric layer are coplanar with each other.

6. The device of claim 5, wherein the plurality of electrical connectors comprises solder regions.

7. The device of claim 5 further comprising a plurality of metal pads underlying the passivation layer and overlying the semiconductor substrate, wherein the plurality of metal pads is electrically coupled to the plurality of electrical connectors through the plurality of RDLs and the plurality of through vias.

8. The device of claim 5 further comprising:
a plurality of micro lenses over the plurality of color filters, wherein each of the plurality of color filters and each of the plurality of micro lenses are aligned to an image sensor in the image sensor array.

9. The device of claim 5, wherein no solder-containing connectors are located over the passivation layer.

10. The device of claim 5, wherein the polymer layer does not overlap the image sensor array.

11. A device comprising:
a semiconductor substrate;
an image sensor in the semiconductor substrate;
a plurality of dielectric layers on a side of the semiconductor substrate;
a metal pad in one of the plurality of dielectric layers;
a color filter and a micro lens aligned to the image sensor;
a through via penetrating through the semiconductor substrate;
a Redistribution Line (RDL) electrically coupled to the through via, wherein the RDL and the plurality of dielectric layers are on a same side of the semiconductor substrate as the micro lens, and the RDL electrically inter-couples the metal pad and the through via;
a dielectric layer underlying the RDL and the color filter, with a bottom surface of the RDL contacting a first top surface of the dielectric layer, and a bottom surface of the color filter contacting a second top surface of the dielectric layer, wherein the first top surface and the second top surface of the dielectric layer are coplanar with each other;
a polymer layer comprising a portion, with a bottom surface of the portion in contact with a top surface and sidewalls of the RDL; and
an oxide layer overlapping and contacting the micro lens, and contacting a top surface and a sidewall of a portion of the polymer layer, with the portion of the polymer layer contacting the RDL, wherein the oxide layer is a conformal layer.

12. The device of claim 11, wherein the oxide layer is in contact with the polymer layer and the micro lens.

13. The device of claim 11, wherein the polymer layer is free from portions aligned to the micro lens.

14. The device of claim 11, wherein the through via further penetrates through the plurality of dielectric layers, with edges of the through via in the semiconductor substrate aligned to respective edges of the through via in the plurality of dielectric layers.

15. The device of claim 1 further comprising:
a plurality of through vias penetrating through the semiconductor substrate; and
a plurality of RDLs over the plurality of dielectric layers, wherein the plurality of RDLs is electrically coupled to the plurality of through vias, wherein the polymer layer comprises a plurality of discrete portions separated from each other, each covering one of the plurality of RDLs.

16. The device of claim 11, wherein the polymer layer comprises a discrete portion covering the RDL.

17. The device of claim 8 further comprising an oxide layer over and in physical contact with the plurality of micro lens, wherein the oxide layer further comprises portions contacting top surfaces of portions of the polymer layer, with the portions of the polymer layer having bottom surfaces contacting top surfaces of the plurality of RDLs.

18. The device of claim 11, wherein the through via extends from a bottom of the RDL to a bottom surface of the semiconductor substrate, and the through via has a substantially uniform width from the bottom of the RDL to the bottom surface of the semiconductor substrate.

19. The device of claim 1, wherein the insulation layer further comprises a portion overlapped by the micro lens, and an entirety of the insulation layer is formed of a same material.

* * * * *